United States Patent
Remington et al.

(12)

(10) Patent No.: US 7,085,175 B2
(45) Date of Patent: Aug. 1, 2006

(54) WORD LINE DRIVER CIRCUIT FOR A STATIC RANDOM ACCESS MEMORY AND METHOD THEREFOR

(75) Inventors: Scott I. Remington, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/991,910

(22) Filed: Nov. 18, 2004

(65) Prior Publication Data

US 2006/0104107 A1 May 18, 2006

(51) Int. Cl.
*G11C 7/00* (2006.01)
*G11C 11/00* (2006.01)

(52) U.S. Cl. .............................. 365/189.09; 365/225.7; 365/230.05

(58) Field of Classification Search ........... 365/189.09, 365/154, 225.7, 230.05, 230.06
See application file for complete search history.

(56) References Cited

U.S. PATENT DOCUMENTS

| 5,687,178 | A | 11/1997 | Herr | |
|---|---|---|---|---|
| 6,181,606 | B1 * | 1/2001 | Choi et al. | 365/185.23 |
| 6,512,705 | B1 * | 1/2003 | Koelling et al. | 365/189.11 |
| 2004/0141362 | A1 * | 7/2004 | Sumitani et al. | 365/154 |
| 2005/0068832 | A1 * | 3/2005 | Andoh | 365/222 |

OTHER PUBLICATIONS

Bhavnagarwala et al., "Dynamic-Threshold CMOS SRAM Cells for Fast, Portable Applications," IEEE, pp. 359-363 (2000).

Joshi et al., "Novel Circuits To Improve SRAM Performance in PD/SOI Technology," 2001 IEEE International SOI Conference, pp. 99-100.

Itoh et al., "A Deep Sub-V, Single Power-Supply SRAM Cell with Multi-Vt, Boosted Storage Node and Dynamic Load," IEEE 1996 Symposium on VLSI Circuits Digest of Technical Papers, pp. 132-133.

* cited by examiner

*Primary Examiner*—Hoai V. Ho
(74) *Attorney, Agent, or Firm*—Daniel D. Hill; James L. Clingan, Jr.

(57) ABSTRACT

A static random access memory (14) has a normal mode of operation and a low voltage mode of operation. A memory array (15) includes memory cells (16) coupled to a first power supply node ($V_{DD}$) for receiving a power supply voltage. A plurality of word line drivers is coupled to word lines of the memory array (15) and to a second power supply node (37). A word line driver voltage reduction circuit (36) has an input coupled to the first power supply node ($V_{DD}$) and an output coupled to the second power supply node (37) for reducing a voltage on the output in relation to a voltage on the input in response to a low power supply voltage signal, and thus improving a static noise margin of the memory cells (16).

35 Claims, 1 Drawing Sheet

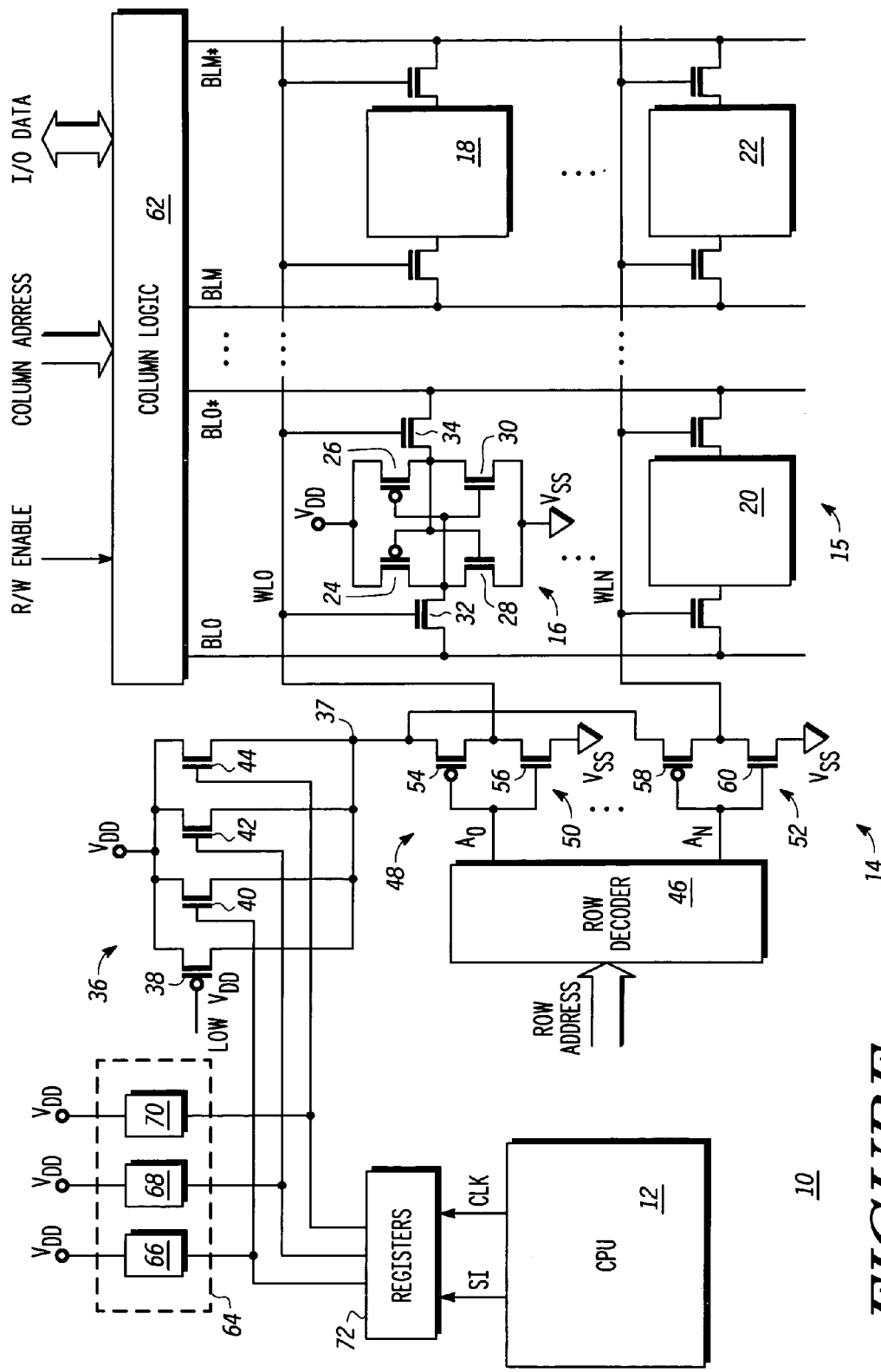
FIGURE

WORD LINE DRIVER CIRCUIT FOR A STATIC RANDOM ACCESS MEMORY AND METHOD THEREFOR

FIELD OF THE INVENTION

This invention relates generally to data processing systems and more particularly to a word line driver circuit for a static random access memory (SRAM) and method therefor.

BACKGROUND OF THE INVENTION

Static random access memories (SRAMs) are generally used in applications requiring high speed, such as a cache memory in a data processing system. A SRAM is usually implemented as an array of memory cells organized in rows and columns. Each SRAM cell stores one bit of data and is implemented as a pair of inverters having their inputs and outputs cross-coupled at differential storage nodes. The SRAM cell is "bistable", that is, it is stable at one of two possible logic levels. The logic state of the cell is determined by whichever of the two inverter outputs is a logic high, and can be made to change states by applying a voltage of sufficient magnitude and duration to the appropriate cell input.

Many applications for embedded SRAMs today require the ability to access the memory array while the integrated circuit is operating in a low power mode. However, the static noise margin of a cell decreases as the power supply voltage decreases. If the cell has inadequate noise margins, the logic state that is stored in the cell may be inadvertently changed when the cell is accessed for a read operation. This is commonly referred to as a "read disturb".

Therefore, what would be desirable is a memory, and a method for operating the memory, that allows operation at lower voltages with adequate static noise margins.

BRIEF DESCRIPTION OF THE DRAWINGS

The FIGURE illustrates, in partial schematic diagram form and partial block diagram form, a data processing system in accordance with the present invention.

DETAILED DESCRIPTION

Generally, the present invention provides a data processing system having an embedded SRAM. During a low power mode of operation, the power supply voltage provided to the word line driver circuits of the memory is reduced by a predetermined voltage below the power supply voltage that is provided to the memory cells. By decreasing the word line driver voltage below the power supply voltage, the static noise margin of the memory array is improved for low voltage operation.

The FIGURE illustrates, in partial schematic diagram form and partial block diagram form, a data processing system 10 in accordance with the present invention. Data processing system 10 includes a central processing unit (CPU) 12, a memory 14, a word line driver power supply control circuit 36, fuse block circuit 64, and registers 72. The memory 14 includes a memory array 15, a row decoder 46, word line driver circuits 48, and column logic 62. The memory array 15 has representative SRAM cells 16, 18, 20, and 22. Memory cell 16 is a conventional six transistor cell and includes P-channel pull-up transistors 24 and 26, N-channel pull-down transistors 28 and 30, and N-channel access transistors 32 and 34. All of the memory cells of array 15 are identical to memory cell 16. The word line driver power supply control circuit 36 includes a plurality of transistors including a P-channel transistor 38, and N-channel transistors 40, 42, and 44, fuse block circuit 64, and registers 72. Word line driver circuits 48 include a word line driver 50 and a word line driver 52. Note that the data processing system 10 may include other circuits not shown in the FIGURE.

In the memory array 15, the memory cells are organized in row and columns. A column of memory cells includes a bit line pair and all of the memory cells coupled to the bit line pair. For example, the bit line pair labeled "BL0" and "BL0"* and cells 16 and 20 comprise one column. Likewise, bit lines BLM and BLM* and memory cells 18 and 22 comprise another column in a memory array having M+1 columns, where M is an integer. Note that a signal name having an asterisk (*) is a logical complement of a signal having the same name but lacking the asterisk. A row of memory array 15 comprises a word line and all of the memory cells coupled to the word line. For example, a word line labeled "WL0" and memory cells 16 and 18 comprise one row. Likewise, word line WLN and memory cells 20 and 22 comprise another row in a memory array having N+1 rows, where N in an integer. Although the FIGURE only illustrates two columns and rows, a memory array generally comprises many rows and columns.

Each of the bit line pairs is coupled to column logic 62, column logic 62 includes, for example, column decoders, sense amplifiers and bit line loads. The read/write enable signal labeled "R/W ENABLE" is provided as an input to column logic 62 and determines whether the memory array will be written to, or read from. During a write operation, the column address labeled "COLUMN ADDRESS" selects which of the columns of the memory array will receive the write data at data terminals labeled "I/O DATA". During a read operation, the COLUMN ADDRESS selects which of the columns will provide read data to the I/O DATA terminals. Row decoder 46 has a plurality of inputs for receiving a row address labeled "ROW ADDRESS". In response to receiving the ROW ADDRESS, the row decoder provides an address signal $A_0$–$A_N$ to select one of the word lines during an access (read or write) to the memory array 15. Each of the address signals $A_0$ through $A_N$ is provided to a corresponding word line driver represented by word line driver circuits 50 and 52. In the illustrated embodiment, the word line drivers are implemented as inverters. In other embodiments, the word line drivers may be a different circuit, such as for example, a non-inverting buffer circuit. Note that read and write operations of memory 14 are conventional, and will not be described further.

Word line driver 50 includes a P-channel pull-up transistor 54 and an N-channel pull-down transistor 56. Word line driver 52 includes a P-channel pull-up transistor 58 and an N-channel pull-down transistor 60. In word line driver 50, the source terminal of the N-channel transistor 56 is coupled to a power supply voltage terminal labeled $V_{SS}$. The commonly connected drains of transistors 54 and 56 provide the output terminal for the word line voltage WL0. The transistors 58 and 60 of the word line driver circuit 52 are coupled together in the same way.

During low power operation, the word line driver power supply control circuit 36 provides a power supply voltage for each of the word line driver circuits that is lower than the power supply voltage $V_{DD}$ by a predetermined voltage. In the illustrated embodiment, the predetermined voltage is a threshold voltage ($V_T$) drop of a transistor. The FIGURE illustrates three N-channel transistors 40, 42, and 44 in the word line driver power supply circuit 36. In the illustrated embodiment, each of these transistors is implemented with a different $V_T$ to provide a different voltage drop when selected. The transistors 40, 42, and 44 are coupled in parallel between $V_{DD}$ and an internal power supply node 37. The source terminals of the P-channel transistors 54 and 58 are also coupled to the internal power supply node 37. In other embodiments, there may be more or fewer than three transistors 40, 42, and 44. The gates of the N-channel transistors 40, 42, and 44 are coupled to registers 72. Registers 72 includes a plurality of programmable bits that are read and written to by CPU 12. CPU 12 has a serial terminal labeled "SI" for programming the bits of registers 72 and a clock terminal for providing a clock signal labeled "CLK" to the registers 72. Each bit of registers 72 corresponds to one of the transistors 40, 42, and 44.

A fuse block 64 having a plurality of fuse circuits is also coupled to the gates of the N-channel transistors 40, 42, and 44. Note that the type of fuse circuit is not important for describing the present invention and can be a conventional fuse circuit such as one used to implement redundancy in a memory. In one embodiment, the fuse block circuit may include a laser blowable fuse (not shown) having one terminal coupled to $V_{DD}$ and a second terminal coupled to the drain of an N-channel transistor (not shown). The gate of the N-channel transistor is biased high at power up of the data processing system. The drain of the N-channel transistor is coupled to an input of a cross-coupled latch circuit (not shown). When the fuse is intact, the input of the cross-coupled latch is pulled high causing the output of the cross-coupled latch to be a logic low. When the fuse is blown, the input of the cross-coupled latch is pulled low, causing the output of the cross-coupled latch provided to one of the N-channel transistors 40, 42, and 44 to be a logic high. In another embodiment, the fuse circuit may be implemented in another way. When one of the fuses is blown, the corresponding fuse circuit 66, 68, or 70 couples the power supply voltage $V_{DD}$ to the gate of the corresponding transistor 40, 42, or 44, respectively.

During normal operation of the memory 14, the enable signal labeled "LOW $V_{DD}$" is provided at a logic low voltage to cause transistor 38 to be conductive. The power supply voltage for the word line driver circuits 48 is provided through the P-channel transistor 38 and is substantially equal to $V_{DD}$. When one of the word lines WL0–WLN is selected, the word line driver circuit provides a logic high word line voltage substantially equal to $V_{DD}$. The unselected word lines are held at about ground potential ($V_{SS}$).

During low voltage operation of the data processing system 10, the power supply voltage is lowered to conserve power. The lower power supply voltage can have detrimental effects on the operation of an SRAM. For example, the static noise margin of the memory cells may be lowered to the extent that memory operation becomes unreliable. To increase the static noise margin at lower power supply voltages, the illustrated embodiment reduces the word line voltage by a predetermined voltage below the power supply voltage, for example, a $V_T$ below $V_{DD}$. This will increase the static noise margin and thus allow reliable memory operation at lower power supply voltages.

During testing of the memory array 15, the registers 72 are used to select each of the transistors 40, 42, and 44 in turn to provide different power supply voltages below $V_{DD}$ to the word line drivers. The low $V_{DD}$ operation of the memory cells of the array 15 is determined for each of the word line driver voltages provided by transistors 40, 42, and 44 in turn. When it is determined which transistor 40, 42, or 44 provides the best low voltage operation of memory 14, the fuse circuit 66, 68, or 70 that corresponds to the gate of the transistor 40, 42, or 44 which provides the best low $V_{DD}$ operation is blown. The fuse of the fuse circuit can be electrically blown or may be laser blown. The blown fuse circuit then permanently biases the gate of that transistor when a power supply voltage is present.

When the data processing system 10 enters a low power mode, the enable signal LOW $V_{DD}$ is asserted as a logic high voltage to cause P-channel transistor 38 to be substantially non-conductive. Note that preferably, the enable signal LOW $V_{DD}$ is provided by a source external to data processing system 10. However, in other embodiments, the enable signal LOW $V_{DD}$ may be provided by another circuit on data processing system 10 such as the CPU 12, or a different circuit not shown in the FIGURE. The power supply for the word line driver circuits is provided via the selected one of the N-channel transistors 40, 42, and 44. By way of example, if the power supply voltage of data processing system 10 is normally 1.2 volts nominal, the power supply voltage provided to $V_{DD}$ during a low power mode may be 0.8 volts or lower. The threshold voltages of the N-channel transistors 40, 42, and 44 may be, for example, selected to be about 40 millivolts (mV), 60 mV, and 80 mV, respectively. If, for example, the voltage provided by N-channel transistor 40 provides the best low power operation, then the fuse circuit 66 is blown and the word line voltage WL0 is equal to about $V_{DD}$ minus 40 mV.

In SRAM bitcell design, one important criterion is called the beta ($\beta$) ratio. The beta ratio of a memory cell is the width/length (W/L) ratio of the pull-down transistor to the W/L ratio of the access transistor. The beta ratio has an effect on access speed and on cell stability. In general, for a given cell size, a higher beta ratio improves cell stability at the expense of lower access speed. Lowering the word line voltage has the effect of increasing the beta ratio.

In other embodiments of the present invention, the word line voltage during low voltage operation may be controlled in different ways. For example, the transistors 40, 42, and 44 may be replaced by voltage dividers. Also, a plurality of series-connected transistors may be used in place of transistors 40, 42, and 44. In addition, the power supply voltage may be provided externally.

By using the plurality of word line driver power supply transistors to provide a word line voltage below $V_{DD}$ during low voltage operation, the static noise margins and thus the reliability of the memory is improved. Also, the present invention allows the memory to operate with a word line voltage equal to about VDD for high speed operation during a normal operating mode.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A circuit, comprising:
    a memory array comprising memory cells coupled to a first power supply node for receiving a power supply voltage, to word lines, and to bit lines;
    a plurality of word line drivers coupled to the word lines and to a second power supply node; and
    a voltage reduction circuit having an input coupled to the first power supply node and an output coupled to the second power supply node for reducing a voltage on the output in relation to a voltage on the input in response to a low supply voltage signal, wherein the low supply signal indicates that the power supply voltage is reduced.

2. The circuit of claim 1, wherein the voltage reduction circuit comprises:
    a first transistor that is decoupled from between the first power supply node and the second supply node in response to the low supply signal being active; and
    a second transistor that is coupled between the first power supply node and the second power supply node when the low supply signal is active.

3. The circuit of claim 2, wherein the first transistor is a P channel transistor and the second transistor is an N channel transistor.

4. The circuit of claim 3, further comprising a fuse block circuit comprising a blown fuse, wherein the fuse block circuit has an output coupled to the second transistor.

5. The circuit of claim 4, further comprising:
    a register coupled to the second transistor; and
    a central processing unit coupled to the register.

6. The circuit of claim 1, further comprising:
    a fuse block circuit comprising a plurality of fuses and coupled to the voltage reduction circuit; and
    a register coupled to the voltage reduction circuit; and
    a central processing unit coupled to the register.

7. The circuit of claim 6, wherein the voltage reduction circuit comprises a plurality of transistors in which each of the plurality of transistors is coupled to a corresponding fuse of the plurality of fuses.

8. The circuit of claim 7, wherein a fuse of the plurality of fuses is blown and the transistor that corresponds to the blown fuse is conductive in response to the blown fuse being blown.

9. The circuit of claim 1, wherein:
    the memory cells are characterized as being static random access memory cells that have a static noise margin that is increased by the voltage reduction circuit reducing the voltage on the output in relation to the voltage on the input.

10. The circuit of claim 9, wherein the voltage reduction circuit comprises:
    a first transistor that is decoupled from between the first power supply node and the second supply node in response to the low supply signal being active; and
    a second transistor that is coupled between the first power supply node and the second power supply node when the low supply signal is active.

11. A circuit having a normal mode of operation and a reduced power mode of operation in which a power supply voltage is reduced, the reduced power mode of operation being indicated by a low supply voltage signal, comprising:
    a memory array having memory cells coupled to a first power supply node for receiving the power supply voltage, to word lines, and to bit lines; and
    word line driver means, coupled to the word lines, for providing the voltage applied to the first power supply node during the normal mode of operation and for providing a voltage reduced below the voltage applied to the first power supply node during the reduced power mode of operation.

12. The circuit of claim 11, wherein the word line driver means comprises:
    a plurality of word line drivers coupled between the word lines and a second power supply node;
    a first transistor that is decoupled from between the first power supply node and the second power supply node in response to the low supply signal being active; and
    a second transistor that is coupled between the first power supply node and the second power supply node when the low supply signal is active.

13. The circuit of claim 12, wherein the first transistor is a P channel transistor and the second transistor is an N channel transistor.

14. The circuit of claim 13, further comprising a fuse block circuit comprising a blown fuse, wherein the fuse block circuit has an output coupled to the second transistor.

15. The circuit of claim 14, further comprising:
    a register coupled to the second transistor; and
    a central processing unit coupled to the register.

16. The circuit of claim 11, further comprising:
    a fuse block circuit comprising a plurality of fuses and coupled to the word line driver means;
    a register coupled to the word line driver means; and
    a central processing unit coupled to the register.

17. The circuit of claim 16, wherein the word line driver means comprises a plurality of transistors in which each of the plurality of transistors is coupled to a corresponding fuse of the plurality of fuses.

18. The circuit of claim 17, wherein a fuse of the plurality of fuses is blown and the transistor that corresponds to the blown fuse is conductive in response to the blown fuse being blown.

19. The circuit of claim 11, wherein:
    the memory cells are characterized as being static random access memory cells that have a static noise margin that is increased by the word line driver means providing a voltage reduced below the voltage applied to the first power supply node.

20. The circuit of claim 19, wherein the word line driver means comprises:
    a plurality of word line drivers coupled between the word lines and a second power supply node;
    a first transistor that is decoupled from between the first power supply node and the second supply node in response to the low supply signal being active; and
    a second transistor that is coupled between the first power supply node and the second power supply node when the low supply signal is active.

21. A circuit, comprising:
    a memory array having memory cells coupled to a first power supply node for receiving the power supply voltage, to word lines, and to bit lines;
    a plurality of word line drivers coupled to the word lines and to a second power supply node; and
    voltage control means coupled to the first power supply node and the second power supply node for providing the first supply voltage to the second power supply node in a normal mode of operation and in response to entering a second mode of operation in which the power supply voltage is reduced, providing a voltage on the second power supply node which is lower than that provided on the first power supply node during the second mode of operation.

22. The circuit of claim 21, wherein the voltage control comprises:
   a first transistor that is decoupled from between the first power supply node and the second supply node in response to entering the second mode of operation; and
   a second transistor that is coupled between the first power supply node and the second power supply node during the second mode of operation.

23. The circuit of claim 22, wherein the first transistor is a P channel transistor and the second transistor is an N channel transistor.

24. The circuit of claim 23, further comprising a fuse block circuit comprising a blown fuse, wherein the fuse block circuit has an output coupled to the second transistor.

25. The circuit of claim 24, further comprising:
   a register coupled to the second transistor; and
   a central processing unit coupled to the register.

26. The circuit of claim 21, further comprising:
   a fuse block circuit comprising a plurality of fuses and coupled to the voltage control means;
   a register coupled to the voltage control means; and
   a central processing unit coupled to the register.

27. The circuit of claim 26, wherein the voltage control means comprises a plurality of transistors in which each of the plurality of transistors is coupled to a corresponding fuse of the plurality of fuses.

28. The circuit of claim 27, wherein a fuse of the plurality of fuses is blown and the transistor that corresponds to the blown fuse is conductive in response to the blown fuse being blown.

29. The circuit of claim 21, wherein:
   the memory cells are characterized as being static random access memory cells that have a static noise margin that is increased by the voltage control means reducing the voltage on the second power supply node in response to entering the second mode of operation.

30. The circuit of claim 29, wherein the voltage control means comprises:
   a first transistor that is decoupled from between the first power supply node and the second supply node in response to entering the second mode of operation; and
   a second transistor that is coupled between the first power supply node and the second power supply node during the second mode of operation.

31. A method of operating a memory comprising:
   a memory array having memory cells coupled to a first power supply node for receiving the power supply voltage, to word lines, and to bit lines; and
   a plurality of word line drivers coupled to the word lines and to a second power supply node;
   the method comprising:
   during a first mode of operation, applying voltages that are substantially equal to a first level to the first power supply node and the second power supply node; and
   during a second mode of operation in which the voltage applied to the first power supply node is at a second level, in which the second level is lower than the first level, applying a voltage to the second power supply node that is lower than the second level.

32. The method of claim 31, wherein the step of applying a voltage to the second power supply node that is lower than the second level comprises decoupling a first transistor from between the first power supply node and the second power supply node while having a second transistor coupled between the first power supply node and the second power supply node.

33. The method of claim 32, wherein the first transistor is a P channel transistor and the second transistor is an N channel transistor.

34. The method of claim 31, wherein the memory cells are further characterized as being static random access memory cells that have a static noise margin and the step of applying a voltage to the second power supply node that is lower than the second level is further characterized as increasing the static noise margin.

35. The method of claim 31, wherein the step of applying a voltage to the second power supply node that is lower than the second level is further characterizing as selecting among a plurality of voltage levels that are below the second level.

* * * * *